(12) United States Patent
Kajiyama (10) Patent No.: US 8,982,321 B2
(45) Date of Patent: Mar. 17, 2015

(54) EXPOSURE METHOD AND EXPOSURE APPARATUS

(75) Inventor: Koichi Kajiyama, Yokohama (JP)

(73) Assignee: V Technology Co., Ltd., Yokohama-shi (JP)

( * ) Notice: Subject to any disclaimer, the term of this patent is extended or adjusted under 35 U.S.C. 154(b) by 665 days.

(21) Appl. No.: 13/251,492

(22) Filed: Oct. 3, 2011

(65) Prior Publication Data

US 2012/0075612 A1 Mar. 29, 2012

Related U.S. Application Data

(63) Continuation of application No. PCT/JP2010/054564, filed on Mar. 17, 2010.

(30) Foreign Application Priority Data

Apr. 3, 2009 (JP) ................................. 2009-090618

(51) Int. Cl.
*G03F 7/20* (2006.01)
(52) U.S. Cl.
CPC ........ *G03F 7/70791* (2013.01); *G03F 7/70283* (2013.01); *G03F 7/70358* (2013.01); *G03F 7/70425* (2013.01)
USPC ..................... 355/53; 355/72; 355/75; 355/77
(58) Field of Classification Search
CPC .............. G03F 7/70283; G03F 7/7035; G03F 7/70358; G03F 7/70466; G03F 7/70475; G03F 7/70691; G03F 7/70791
USPC ................................ 355/53, 72, 75, 77; 430/5
See application file for complete search history.

(56) References Cited

U.S. PATENT DOCUMENTS

| | | | |
|---|---|---|---|
| 6,160,611 A | 12/2000 | Miyake | |
| 2004/0150805 A1* | 8/2004 | Iizuka et al. | 355/53 |

(Continued)

FOREIGN PATENT DOCUMENTS

| | | |
|---|---|---|
| JP | 11-212266 A | 8/1999 |
| JP | 11-237744 A | 8/1999 |

(Continued)

OTHER PUBLICATIONS

International Search Report from the Japanese Patent Office in International Application No. PCT/JP2010/054564 mailed Jun. 22, 2010.

(Continued)

*Primary Examiner* — Steven H Whitesell Gordon
(74) *Attorney, Agent, or Firm* — Finnegan, Henderson, Farabow, Garrett & Dunner, L.L.P.

(57) ABSTRACT

In the present invention, while conveying a subject to be exposed, when exposure on a first exposure area of the subject to be exposed is completed, the exposure being performed by using a first mask pattern group of a photomask in which a plurality of types of mask pattern groups corresponding to each exposure pattern is arranged and formed in a conveying direction of the exposure to be exposed at a predetermined interval, the photomask is moved in synchronization with a conveying speed of the exposure to be exposed and the mask pattern group is switched from the first mask pattern group to a second mask pattern group. When the switching of the mask pattern group of the photomask 11 is completed, the movement of the photomask is stopped, exposure on a second exposure area of the subject to be exposed 8 is performed by the mask pattern group.

4 Claims, 6 Drawing Sheets

(56) References Cited

U.S. PATENT DOCUMENTS

2005/0040399 A1* 2/2005 Kuo et al. .................. 257/72
2009/0136856 A1* 5/2009 Lin et al. .................... 430/5

FOREIGN PATENT DOCUMENTS

| | | |
|---|---|---|
| JP | 2002-99097 A | 4/2002 |
| JP | 2005-345586 A | 12/2005 |
| JP | 2008-310217 A | 12/2008 |
| TW | 200423199 | 11/2004 |
| WO | PCT/JP2010/054564 | 3/2010 |

OTHER PUBLICATIONS

Japanese Office Action corresponding to counterpart Japanese application No. 2009-090618, mailed Apr. 9, 2013.

Japanese Office Action corresponding to counterpart Japanese Application No. 2009-090618, issued Apr. 9, 2013.

* cited by examiner

EXPOSURE METHOD AND EXPOSURE APPARATUS

This application is a continuation of PCT/JP2010/054564, filed on Mar. 17, 2010.

BACKGROUND OF THE INVENTION

1. Field of the Invention

The present invention relates to an exposure method and an exposure apparatus for forming a different exposure pattern on each of a plurality of exposure areas set on a subject to be exposed while conveying the subject to be exposed in one direction. In particular, the invention relates to an exposure method and an exposure apparatus for enhancing formation efficiency of a plurality of types of exposure patterns.

2. Description of Related Art

Conventionally, in this type of exposure method, while a subject to be exposed is being conveyed in one direction, one mask pattern group of a photomask is selected and one exposure pattern group is formed on a predetermined exposure area of a subject to be exposed by exposure using the one mask pattern group. Next, the subject to be exposed is returned to a standby position at which the subject to be exposed is positioned before starting exposure, and then, the mask pattern group of the photomask is switched to another mask pattern group, and thereafter, the subject to be exposed is conveyed again and another exposure pattern group is formed on another exposure area of the subject to be exposed by exposure using the another mask pattern group (for example, see Japanese Laid-Open Patent Publication No. 2008-310217).

However, in such a conventional exposure method, every time the exposure by one mask pattern group is completed, the subject to be exposed is returned to the standby position at which the subject to be exposed is positioned before the exposure is started, so that the more the types of the exposure patterns to be formed, the longer the total movement distance in which the subject to be exposed moves until all exposures to the subject to be exposed are completed. Therefore, when a plurality of exposure patterns is formed on the same object to be exposed, there is a problem that the formation efficiency of exposure patterns is low.

Therefore, in view of the above-mentioned problems, an object of the present invention is to provide an exposure method and an exposure apparatus for enhancing the formation efficiency of a plurality of types of exposure patterns on the same subject to be exposed.

SUMMARY OF THE INVENTION

In order to achieve the above-mentioned object, the exposure method according to the present invention is a method for forming a different exposure pattern on each of a plurality of exposure areas set on a subject to be exposed in a conveying direction of the subject to be exposed at a predetermined interval while conveying the subject to be exposed in one direction, and the exposure method includes the steps of: moving a photomask in synchronization with a conveying speed of the subject to be exposed and switching a mask pattern group from one mask pattern group to another mask pattern group when exposure on one exposure area of the subject to be exposed is completed, the exposure being performed by using the one mask pattern group of the photomask in which a plurality of types of mask pattern groups corresponding to each exposure pattern is arranged and formed in the conveying direction of the subject to be exposed at a predetermined interval; and stopping the movement of the photomask and performing exposure on the following exposure area of the subject to be exposed by using the another mask pattern group when the switching the mask pattern group from the one mask pattern group of the photomask to the another mask pattern group is completed.

By the above-mentioned configuration, exposure is performed while conveying the subject to be exposed in one direction by using one mask pattern group of a photomask in which a plurality of types of mask pattern groups corresponding to each exposure pattern are arranged and formed in the conveying direction of the subject to be exposed at a predetermined interval. When the exposure on one exposure area of the subject to be exposed is completed, a photomask is moved in synchronization with a conveying speed of the subject to be exposed and one mask pattern group is switched to another mask pattern group. When the switching the mask pattern group from the one mask pattern group of the photomask to the other mask pattern group is completed, the movement of the photomask is stopped, exposure on the following exposure area of the subject to be exposed is performed by using the other mask pattern group, and different exposure patterns are formed for each of a plurality of exposure areas set on the subject to be exposed in the conveying direction of the subject to be exposed at a predetermined interval.

The photomask moves in the conveying direction of the subject to be exposed. Then, the mask pattern group is switched by moving the photomask in the conveying direction of the subject to be exposed.

The exposure apparatus according to the present invention is an apparatus for forming a different exposure pattern on each of a plurality of exposure areas set on an subject to be exposed in a conveying direction of the subject to be exposed at a predetermined interval while conveying the subject to be exposed in one direction, and the exposure apparatus includes: a conveying device which conveys the subject to be exposed at a predetermined speed; and a mask stage which is arranged to face an upper surface of the conveying device and which holds a photomask in which a plurality of types of mask pattern groups corresponding to each exposure pattern are formed at a predetermined interval in the conveying direction of the subject to be exposed, the mask stage being formed to be able to move in synchronization with the movement of the conveying device. When exposure, which is performed by using one mask pattern group of the photomask, on one exposure area of the subject to be exposed is completed, the mask stage is moved, the mask pattern group is switched from the one mask pattern group to another mask pattern group, and exposure on the following exposure area of the subject to be exposed is performed by using the other mask pattern group.

By the above-mentioned configuration, when exposure on one exposure area of the subject to be exposed is completed, the exposure being performed while conveying the object to be exposed in one direction by using one mask pattern group of a photomask, the one mask pattern group of the photomask is switched to another mask pattern group by moving the mask stage in synchronization with the movement of the subject to be exposed, exposure on the following exposure area of the subject to be exposed is performed by using the another mask pattern group, and different exposure patterns are formed for each of a plurality of exposure areas set on the subject to be exposed in the conveying direction of the subject to be exposed at a predetermined interval.

The mask stage moves in the conveying direction of the subject to be exposed. Then, the mask pattern group is switched by moving the photomask in the conveying direction of the subject to be exposed.

According to a first or third aspect of the present invention, different from the conventional art, it is possible to form different exposure patterns on each of a plurality of exposure areas while continuously moving the subject to be exposed at a predetermined speed without returning the subject to be exposed to a standby position at which the subject to be exposed is positioned before the exposure is started each time exposure on a predetermined exposure area is completed. Therefore, the total movement distance of the subject to be exposed until all the exposure is completed is significantly shorter than that of the conventional art. Thus, the formation efficiency of a plurality of types of exposure patterns on the same subject to be exposed is further enhanced compared with that of the conventional art.

According to a second or fourth aspect of the present invention, it is possible to form a proximity exposure apparatus in which a photomask is arranged to approach and face the subject to be exposed.

DESCRIPTION OF THE PREFERRED EMBODIMENTS

Figure 1:
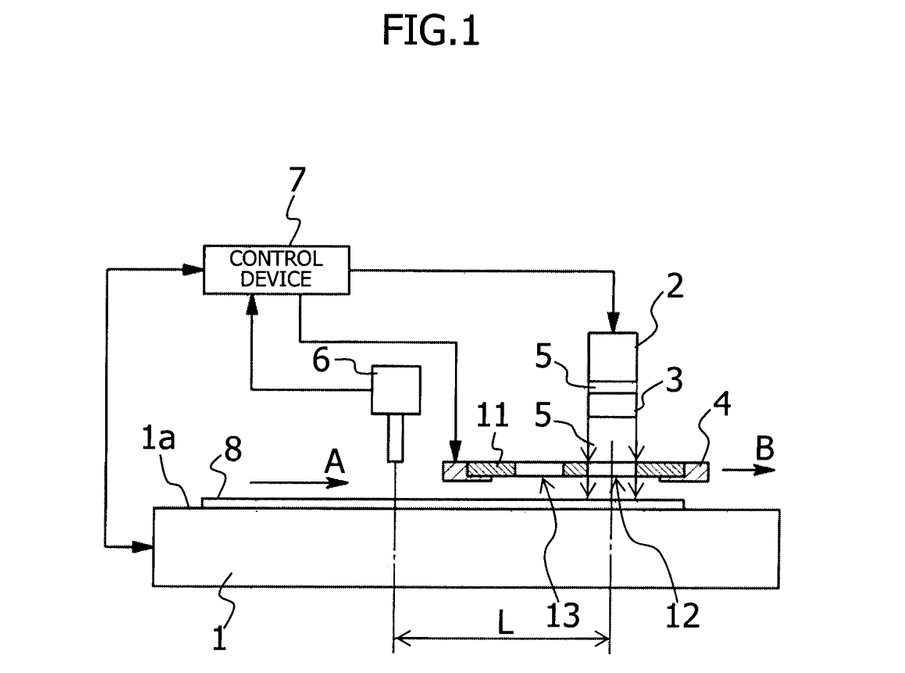
FIG. 1 is a schematic view of an embodiment of an exposure apparatus according to the present invention.

Hereinafter, an embodiment of the present invention will be described in detail with reference to the drawings. FIG. 1 is a schematic view of the embodiment of an exposure apparatus according to the present invention. The exposure apparatus forms a different exposure pattern on each of a plurality of exposure areas set on a subject to be exposed while conveying the subject to be exposed in one direction at all times when an exposure process is performed. The exposure apparatus includes a conveying device 1, a light source 2, a coupling optical system 3, a mask stage 4, an imaging device 6, and a control device 7.

The conveying device 1 conveys a subject to be exposed 8 placed on an upper surface 1a of the conveying device 1 in a direction indicated by an arrow A at a predetermined speed. The conveying device 1 emits air from the upper surface 1a as well as absorbs air. Thus, emission power and absorption power of the air are controlled to float the subject to be exposed 8 by a predetermined amount. In this state, both ends of the subject to be exposed 8 are held by conveying rollers not shown in FIG. 1 to convey the subject to be exposed 8. The conveying device 1 is provided with a speed sensor for detecting a moving speed of the subject to be exposed 8 and a position sensor (not shown in FIG. 1) for detecting the position of the subject to be exposed 8.

Figure 2:
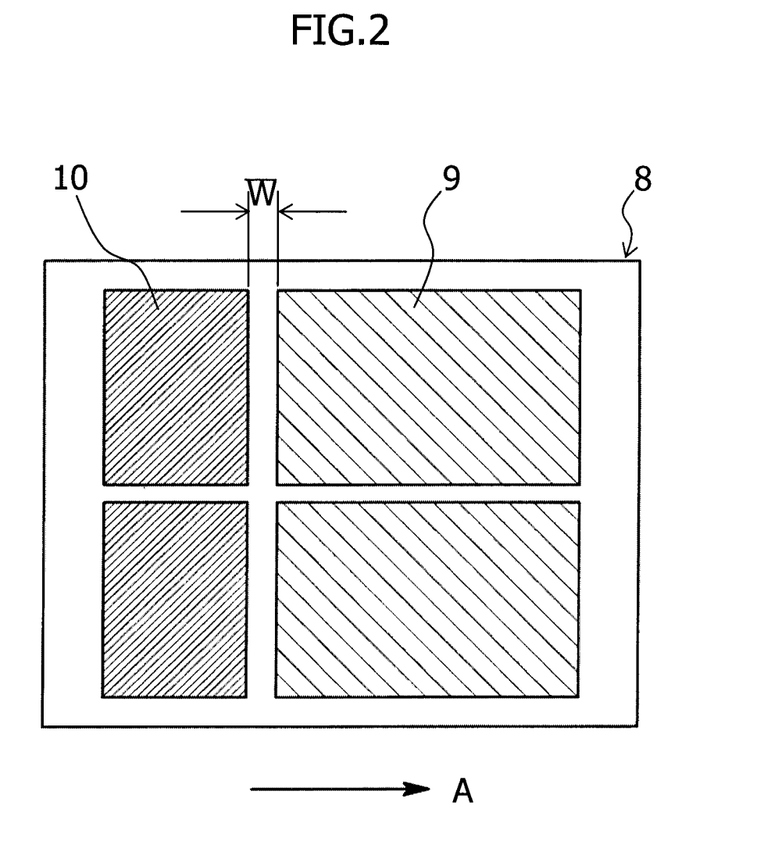
FIG. 2 is a plan view of a setting example of exposure areas set on a surface of a subject to be exposed used in the exposure apparatus.

As shown in FIG. 2, on the subject to be exposed 8 used here, a first exposure area 9 in which a first exposure pattern group is formed and a second exposure area 10 in which a second exposure pattern group is formed are set in advance in a conveying direction (indicated by the arrow A) at an interval W. For example, the subject to be exposed 8 is a color filter substrate.

The light source 2 is provided above the conveying device 1. The light source 2 emits ultraviolet light as source light 5. The light source 2 is a xenon lamp, an extra high pressure mercury lamp, a laser light source, or the like.

The coupling optical system 3 is provided in front of a light emitting direction of the light source 2. The coupling optical system 3 converts the source light 5 emitted from the light source 2 into parallel light and irradiates the parallel light to a mask pattern group of a photomask 11 described below. The coupling optical system 3 includes optical components such as a photo integrator and a condenser lens. The coupling optical system 3 further includes a mask for forming a cross-sectional shape of the source light 5 according to an outer shape of an area of the mask pattern groups of the photomask 11.

Figure 3:
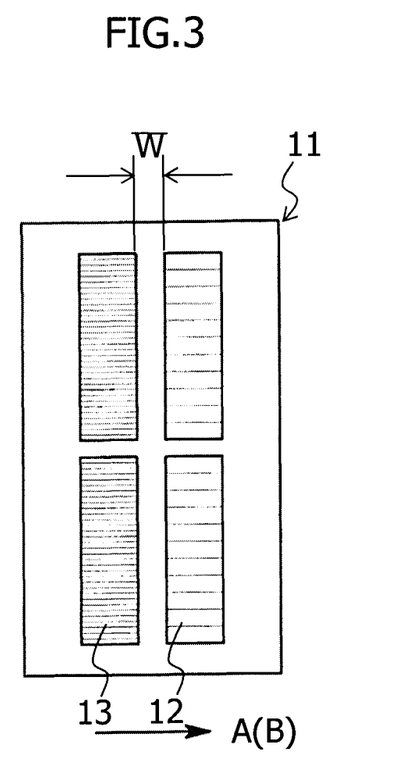
FIG. 3 is a plan view of a configuration example of a photomask used in the exposure apparatus.

The mask stage 4 is provided to face the upper surface of the conveying device 1. The mask stage 4 holds outer edges of the photomask 11 on which a first and a second mask pattern groups 12 and 13 corresponding to the first and the second exposure pattern groups, respectively, different from each other formed on the subject to be exposed 8 are arranged and formed in the conveying direction (arrow A direction) of the subject to be exposed 8 at the same interval W as that between the first and the second exposure areas 9 and 10 set on the subject to be exposed 8, as shown in FIG. 3. The mask stage 4 is formed to be able to move in synchronization with the movement speed of the subject to be exposed 8 in the same direction (arrow B direction) as the conveying direction of the subject to be exposed 8 indicated by the arrow A.

The imaging device 6 is provided to be able to capture an image of a position a predetermined distance away from an exposure position of the photomask 11 in the direction opposite to the conveying direction (arrow A direction). The imaging device 6 captures an image of the surface of the subject to be exposed 8. The imaging device 6 is a line camera in which a plurality of light receiving elements are linearly aligned in a direction substantially perpendicular to the conveying direction in the plane parallel to the upper surface of the conveying device 1. Specifically, the imaging device 6 is arranged to capture an image of a position away from an exposure center position of the mask pattern group of the photomask 11 by a distance L in the direction opposite to the conveying direction.

Figure 4:
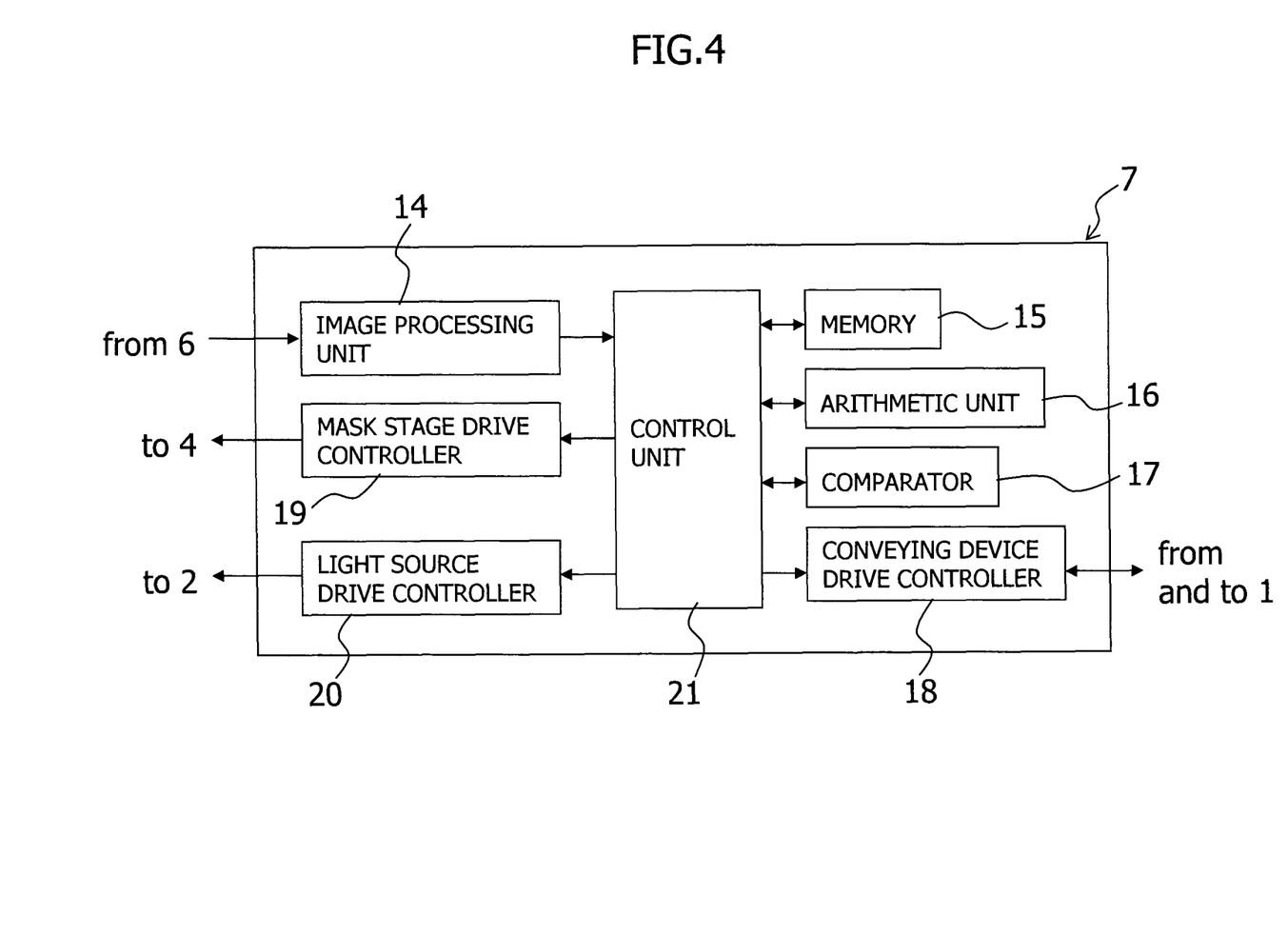
FIG. 4 is a block diagram of a schematic configuration of a control device of the exposure apparatus.

The control device 7 is electrically connected to the conveying device 1, the light source 2, the mask stage 4, and the imaging device 6. The control device 7 appropriately controls the movements of the conveying device 1 and the mask stage 4. As shown in FIG. 4, the control device 7 includes an image processing unit 14, a memory 15, an arithmetic unit 16, a comparator 17, a conveying device drive controller 18, a mask stage drive controller 19, a light source drive controller 20, and a control unit 21.

Here, the image processing unit 14 performs image processing on an image of the surface of the subject to be exposed 8 captured by the imaging device 6 and detects the front positions of the exposure areas 9 and 10 in the conveying direction. The memory 15 stores the lengths of the exposure areas 9 and 10 in the arrow A direction, the distance L between the exposure center position of the photomask 11 and the image capturing position of the imaging device 6, and the like, and temporarily stores a calculation result of the arithmetic unit 16 described below. Furthermore, the arithmetic unit 16 calculates the movement distance of the subject to be exposed 8 on the basis of an output of the position sensor of the conveying device 1. Furthermore, the comparator 17 compares the movement distance of the conveying device 1 calculated by the arithmetic unit 16 with the each length read from the memory 15. The conveying device drive controller 18 controls drive of the conveying device 1 so that the subject to be exposed 8 moves at a predetermined speed. The mask stage drive controller 19 moves the mask stage 4 in synchronization with the movement of the subject to be exposed 8 and switches the mask pattern group of the photomask 11 from the first mask pattern group 12 to the second mask pattern group 13. Furthermore, the light source drive controller 20 controls drive to turn on and off the light source 2. The control unit 21 integrally controls the entire apparatus so that the constituent elements described above are appropriately driven.

Figure 5:
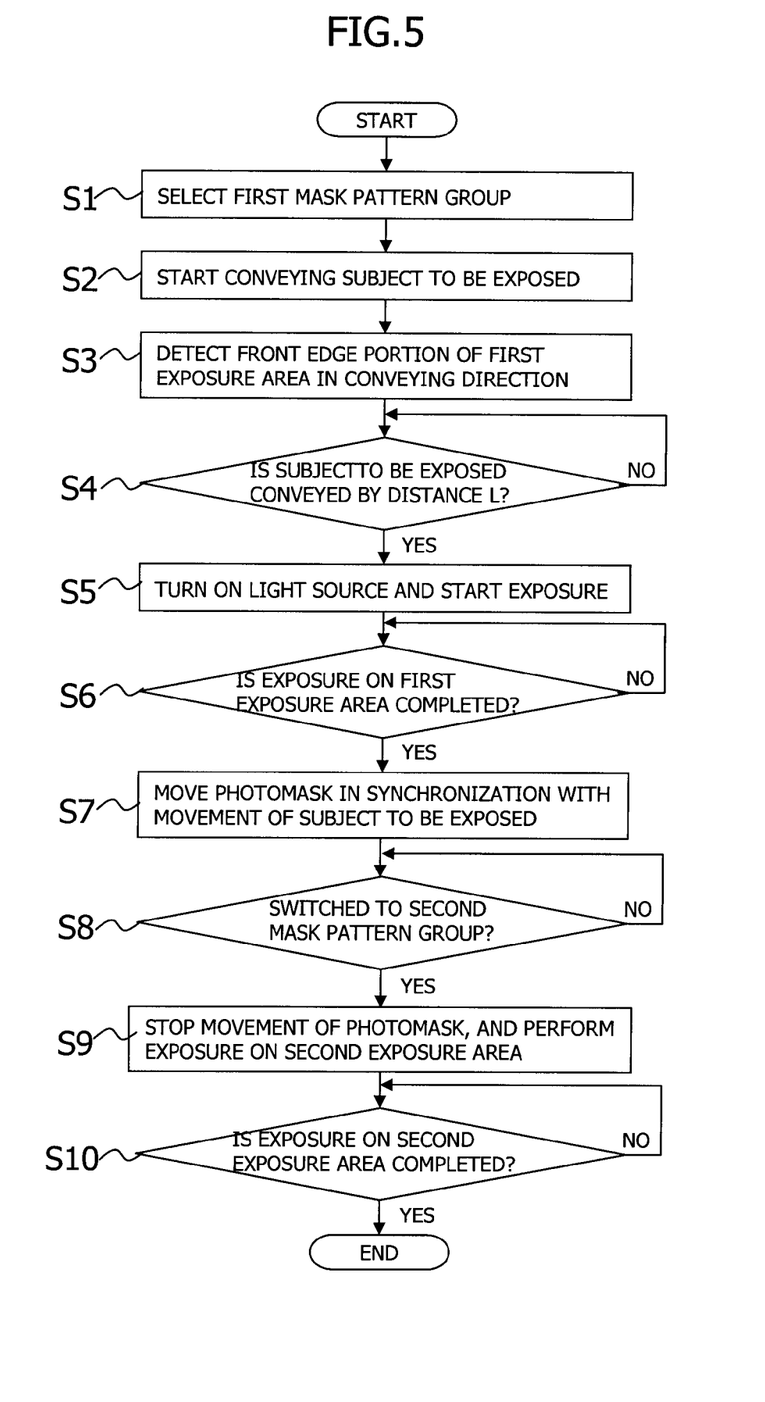
FIG. 5 is a flowchart of an exposure method of the present invention.

Next, an operation of the exposure apparatus configured as described above and an exposure method performed by using the exposure apparatus will be described with reference to FIG. 5. Here, a case will be described in which the first exposure area 9 and the second exposure area 10, on the each surfaces of which different exposure patterns are formed, are set on the subject to be exposed 8 at the interval W in the conveying direction.

First, in step S1, the mask stage 4 stops at a standby position and the first mask pattern group 12 of the photomask 11 is selected.

In step S2, the conveying device 1 is controlled and driven by the conveying device drive controller 18, and an operation for conveying the subject to be exposed 8 in the arrow A direction at a predetermined speed is started.

In step S3, the image processing unit 14 performs image processing on an image of the surface of the subject to be exposed 8 captured by the imaging device 6, and a front edge portion of a reference pattern group, which includes a plurality of reference patterns formed in advance in the first exposure area 9, in the arrow A direction is detected at a front edge portion of the first exposure area 9 in the arrow A direction.

In step S4, after the front edge portion of the first exposure area 9 in the arrow A direction is detected on the basis of the output of the position sensor of the conveying device 1, the arithmetic unit 16 calculates a distance by which the subject to be exposed 8 moves. Then, the comparator 17 compares the calculated distance by which the subject to be exposed 8 moves with the distance L read from the memory 15. If both distances correspond to each other and, in step S4, it is determined to be YES, the process proceeds to step S5.

Figure 6A:
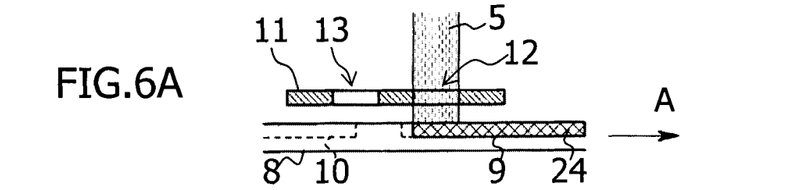
FIG. 6 is an explanatory view of the exposure method of the present invention.

In step S5, the light source drive controller 20 starts and turns on the light source 2. Then, the source light 5, which is emitted from the light source 2 and converted into parallel light through the coupling optical system 3, and the cross-sectional shape of which is further formed according to an outer shape of the mask pattern group, is irradiated to the first mask pattern group 12 of the photomask 11, and a first exposure pattern 24 is formed by exposure on the first exposure area 9 of the subject to be exposed 8 (see FIG. 6A).

Figure 6B:
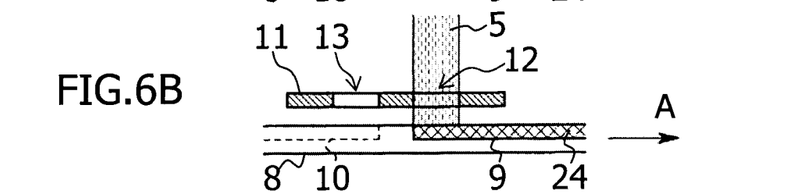

In step S6, a movement distance of the subject to be exposed 8 is calculated by the arithmetic unit 16 on the basis of the output of the position sensor of the conveying device 1, the distance is compared with the length of the first exposure area 9 in the arrow A direction read from the memory 15 by the comparator 17, and it is determined whether or not the distance and the length correspond to each other and the exposure on the first exposure area 9 is completed. If the distance and the length correspond to each other (see FIG. 6B) and, in step S6, it is determined to be YES, the process proceeds to step S7.

Figure 6C:
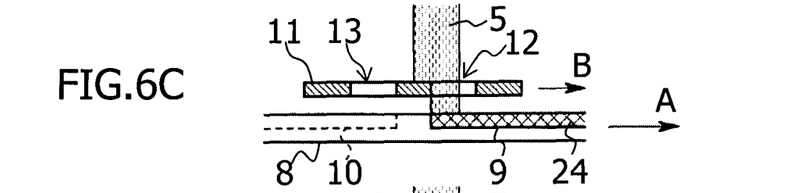
Figures 6D, 6E:
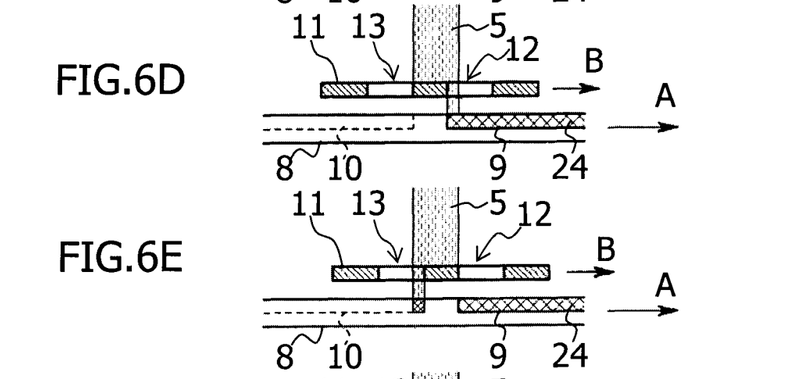

In step S7, the mask stage drive controller 19 starts and moves the mask stage 4 in the arrow B direction in synchronization with the conveyance speed of the object to be exposed 8 (see FIGS. 6C, 6D, and 6E). FIG. 6C shows a state in which exposure is performed on the first exposure area 9 of the subject to be exposed 8 by a rear portion of the first mask pattern group 12 of the photo mask 11 in the arrow B direction while the photomask 11 moves in the arrow B direction in synchronization with the movement of the subject to be exposed 8. FIG. 6D shows a state in which the photomask 11 further moves and the front end portion of the second mask pattern group 13 of the photo mask 11 in the arrow B direction corresponds to the rear end portion of the source light 5 in the arrow A (or the arrow B) direction, and FIG. 6E shows a state in which the photomask 11 further moves and the rear end portion of the first mask pattern group 12 of the photo mask 11 in the arrow B direction corresponds to the front end portion of the source light 5 in the arrow A (or the arrow B) direction, and shows a state in which exposure on the second exposure area 25 of the subject to be exposed 8 is started.

In step S8, the movement distance of the mask stage 4 is detected on the basis of a position sensor (not shown in the drawings) included in the mask stage 4, and the mask stage drive controller 19 determines whether or not the mask stage 4 moves by a predetermined distance and the mask pattern group of the photomask 11 is completely switched from the first mask pattern group 12 to the second mask pattern group 13. Here, when the switching from the first mask pattern group 12 to the second mask pattern group 13 is completed, in step S8, it is determined to be YES, and the process proceeds to step S9.

Figure 6F:
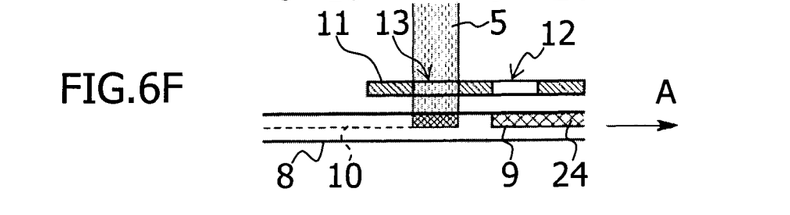

In step S9, the movement of the mask stage 4 is stopped by the mask stage drive controller 19, exposure is performed on the second exposure area 10 of the subject to be exposed 8 which is moving continuously, by using the second mask pattern group 13 of the photomask 11, and the second exposure pattern 25 is formed (see FIG. 6F).

In step S10, a movement distance of the subject to be exposed 8 is calculated by the arithmetic unit 16 on the basis of the output of the position sensor of the conveying device 1, the distance is compared with the length of the second exposure area 10 in the arrow A direction read from the memory 15 by the comparator 17, and it is determined whether or not the distance and the length correspond to each other and the exposure on the second exposure area 10 is completed. Here, if the distance and the length correspond to each other and "YES" is determined, the exposure ends. The light source 2 is turned off by the control of the light source drive controller 21 and the drive of the conveying device 1 is stopped by the control of the conveying device drive controller 18. Here, if a plurality of subjects to be exposed 8 is sequentially conveyed and exposure is continuously performed on the plurality of subjects to be exposed 8, the conveying device 1 is continuously driven.

Although, in the above embodiment, a case in which there are two exposure areas set on the subject to be exposed 8 is described, the present invention is not limited to this, and there may be three or more exposure areas set on the subject to be exposed 8. In this case, three or more mask pattern groups are arranged in the conveying direction of the subject to be exposed 8 (arrow A direction), and when step S10 is completed, the process returns to step S7, and steps S7 to S10 are repeatedly performed until the exposure on all the exposure areas is completed.

Although, in the above embodiment, a case is described in which the embodiment is applied to a proximity exposure apparatus in which the photomask 11 is arranged to approach and face the subject to be exposed 8, the present invention is not limited to this, and the embodiment may be applied to a projection exposure apparatus in which the exposure is performed by projecting the mask pattern group of the photomask 11 onto the subject to be exposed 8. In this case, the movement direction of the photomask 11 is opposite to the conveying direction of the subject to be exposed 8.

It should be noted that the entire contents of Japanese Patent Application No. 2009-090618, filed on Apr. 3, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. An exposure method for forming a different exposure pattern on each of a plurality of exposure areas set on a subject to be exposed in a conveying direction of the subject to be exposed at a predetermined interval while continuously conveying the subject to be exposed in one direction at a predetermined speed, the exposure method comprising:

using one mask pattern group of a photomask in which a plurality of types of mask pattern groups corresponding to each exposure pattern is arranged and formed in the conveying direction of the subject to be exposed at an interval which is the same as the predetermined interval, and performing exposure on one exposure area of the subject to be exposed which is moving while the photomask is stopped, and when a rear end portion of the one exposure area in the conveying direction of the subject to be exposed is aligned with a rear end portion of the one mask pattern group in the same direction, moving the photomask in synchronization with the movement of the subject to be exposed to switch from the one mask pattern group to another mask pattern group; and stopping the movement of the photomask and performing exposure on the following exposure area of the moving subject to be exposed by using the another mask pattern group when the switching from the one mask pattern group of the photomask to the another mask pattern group is completed.

2. The exposure method according to claim 1, wherein the photomask is moved in the conveying direction of the subject to be exposed.

3. An exposure apparatus for forming a different exposure pattern on each of a plurality of exposure areas set on a subject to be exposed in a conveying direction of the subject to be exposed at a predetermined interval while continuously conveying the subject to be exposed in one direction at a predetermined speed, the exposure apparatus comprising:

a conveying device for conveying the subject to be exposed at the predetermined speed;

a mask stage which is arranged to face an upper surface of the conveying device and which holds a photomask in which a plurality of types of mask pattern groups corresponding to each exposure pattern is formed at an interval which is the same as the predetermined interval in the conveying direction of the subject to be exposed, the mask stage being formed to be able to move in synchronization with the movement of the conveying device; and a controller configured to control exposure on one exposure area of the moving subject to be exposed is performed by using one mask pattern group of the photomask while the mask stage is stopped, and when a rear end portion of the one exposure area in the conveying direction of the subject to be exposed is aligned with a rear end portion of the one mask pattern group in the same direction, the mask stage is moved in synchronization with the movement of the subject to be exposed, to switch from the one mask pattern group to another mask pattern group, and when the switching from the one mask pattern group to another mask pattern group is completed, the mask stage is stopped and exposure on the following exposure area of the moving subject to be exposed is performed by using the another mask pattern group.

4. The exposure apparatus according to claim 3, wherein the mask stage moves in the conveying direction of the subject to be exposed.

* * * * *